United States Patent
Bedell et al.

(10) Patent No.: US 9,018,675 B2
(45) Date of Patent: Apr. 28, 2015

(54) HETEROJUNCTION III-V PHOTOVOLTAIC CELL FABRICATION

(71) Applicant: International Business Machines Corporation, Armonk, NY (US)

(72) Inventors: Stephen W. Bedell, Yorktown Heights, NY (US); Norma Sosa Cortes, Yorktown Heights, NY (US); Keith E. Fogel, Yorktown Heights, NY (US); Devendra Sadana, Yorktown Heights, NY (US); Ghavam Shahidi, Yorktown Heights, NY (US); Davood Shahrjerdi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/309,917

(22) Filed: Jun. 20, 2014

(65) Prior Publication Data
US 2014/0299181 A1 Oct. 9, 2014

Related U.S. Application Data

(62) Division of application No. 12/713,584, filed on Feb. 26, 2010, now Pat. No. 8,802,477.

(60) Provisional application No. 61/185,247, filed on Jun. 9, 2009.

(51) Int. Cl.
| | |
|---|---|
| *H01L 31/102* | (2006.01) |
| *H01L 27/148* | (2006.01) |
| *H01L 31/0725* | (2012.01) |
| *H01L 31/074* | (2012.01) |
| *H01L 31/075* | (2012.01) |

(Continued)

(52) U.S. Cl.
CPC ........ *H01L 31/0304* (2013.01); *H01L 31/0725* (2013.01); *H01L 31/074* (2013.01); *H01L 31/075* (2013.01); *H01L 31/076* (2013.01); *H01L 31/1892* (2013.01); *H01L 31/20* (2013.01); *H01L 21/76254* (2013.01); *H01L 31/03762* (2013.01); *H01L 31/184* (2013.01); *Y02E 10/548* (2013.01)

(58) Field of Classification Search
USPC .......... 438/57, 72–74, 94, 96, 458, 510, 542, 438/544, 558–564; 257/E31.019, E31.004; 136/255
See application file for complete search history.

(56) References Cited

U.S. PATENT DOCUMENTS

| | | | |
|---|---|---|---|
| 4,582,559 A | 4/1986 | Tanielian et al. | |
| 6,951,819 B2 * | 10/2005 | Iles et al. | 438/705 |

(Continued)

FOREIGN PATENT DOCUMENTS

TW 200919576 A 5/2009

OTHER PUBLICATIONS

Llist of IBM Patents or Patent Applications Treated As Related—Date Filed: Jun. 20, 2014; 1 page.

*Primary Examiner* — Calvin Choi
(74) *Attorney, Agent, or Firm* — Cantor Colburn LLP; Vazken Alexanian

(57) ABSTRACT

A heterojunction III-V photovoltaic (PV) cell includes a base layer comprising a III-V substrate, the base layer being less than about 20 microns thick; an intrinsic layer located on the base layer; an amorphous silicon layer located on the intrinsic layer; and a transparent conducting oxide layer located on the amorphous silicon layer.

7 Claims, 8 Drawing Sheets

(51) Int. Cl.
*H01L 31/076* (2012.01)
*H01L 31/18* (2006.01)
*H01L 31/20* (2006.01)
*H01L 21/762* (2006.01)
*H01L 31/0376* (2006.01)
*H01L 21/00* (2006.01)
*H01L 21/30* (2006.01)
*H01L 21/46* (2006.01)
*H01L 31/0304* (2006.01)

(56) References Cited

U.S. PATENT DOCUMENTS

2005/0268963 A1* 12/2005 Jordan et al. .................. 136/256
2007/0249140 A1    10/2007 Dross et al.
2007/0298238 A1* 12/2007 Witvrouw et al. ......... 428/304.4
2008/0241986 A1* 10/2008 Rohatgi et al. .................. 438/72
2009/0211623 A1*  8/2009 Meier et al. .................. 136/246

* cited by examiner

FORM INTRINSIC LAYER, BACK SURFACE FIELD, AND AMORPHOUS SILICON LAYER ON SUBSTRATE
501

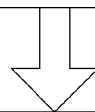

FORM TENSILE STRESSED METAL LAYER OVER AMORPHOUS SILICON LAYER; ADHERE FLEXIBLE SUBSTRATE TO METAL LAYER
502

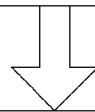

SPALL BASE LAYER, INTRINSIC LAYER, BACK SURFACE FIELD, AND AMORPHOUS SILICON LAYER FROM SUBSTRATE USING FLEXIBLE SUBSTRATE AND TENSILE STRESSED METAL LAYER
503

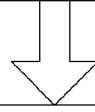

REMOVE FLEXIBLE SUBSTRATE FROM METAL LAYER
504

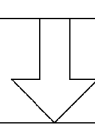

FORM INTRINSIC LAYER, AMORPHOUS SILICON LAYER, AND TRANSPARENT CONDUCTING OXIDE LAYER OVER BASE LAYER
505

HETEROJUNCTION III-V PHOTOVOLTAIC CELL FABRICATION

CROSS-REFERENCE TO RELATED APPLICATION

This Divisional Application claims the benefit of U.S. application Ser. No. 12/713,584 filed Feb. 26, 2010 which claims the benefit of U.S. Provisional Application Ser. No. 61/185,247 filed Jun. 9, 2009, the contents of which are hereby incorporated in their entirety.

FIELD

This disclosure relates generally to the field of heterojunction photovoltaic cell fabrication.

DESCRIPTION OF RELATED ART

Silicon (Si) based heterojunction intrinsic thin layer (HIT) photovoltaic (PV) cells may comprise a bulk single-crystalline silicon (sc-Si) base layer sandwiched between two layers of amorphous Si (a-Si). The use of a-Si layers in an HIT cell gives the HIT cell a wider bandgap than a cell comprising only sc-Si. The a-Si layer also creates an energy barrier at the interface between the a-Si and the sc-Si base layer, which keeps minority carriers away from the interface, thereby reducing the recombination rate in the cell. Additionally, a-Si may be processed at a relatively low temperature. The HIT cell structure may have a sc-Si substrate thickness in the range of a few tens of microns ($\mu m$). This substrate thickness is smaller than the diffusion length of the minority carriers in the PV cell, while being sufficiently thick to allow maximum absorption of the solar spectrum.

SUMMARY

In one aspect, a heterojunction III-V photovoltaic (PV) cell includes a base layer comprising a III-V substrate, the base layer being less than about 20 microns thick; an intrinsic layer located on the base layer; an amorphous silicon layer located on the intrinsic layer; and a transparent conducting oxide layer located on the amorphous silicon layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 2 illustrates an embodiment of a substrate having a back surface field, metal layer, and a flexible substrate layer.

FIG. 5 illustrates an embodiment of a method of forming a double heterojunction III-V cell via spalling.

FIG. 6 illustrates an embodiment of a substrate having an intrinsic layer, a back surface field, an amorphous silicon layer, a metal layer, and a flexible substrate layer.

DETAILED DESCRIPTION

Embodiments of systems and methods for heterojunction (HJ) III-V PV cell fabrication are provided, with exemplary embodiments being discussed below in detail. An HJ solar cell may be formed using a base layer comprising a III-V based substrate, such as germanium (Ge) or gallium arsenide (GaAs), in place of sc-Si. In a III-V based substrate, the diffusion length of the minority carriers is relatively small in comparison to the substrate thickness. Due to its direct band gap, a relatively thin layer (a few microns thick) of a III-V based substrate is capable of effectively absorbing a large portion of the solar spectrum, unlike sc-Si. An HJ III-V PV cell structure comprises a base layer comprising a III-V substrate that is less than about 20 $\mu m$ thick in some embodiments. Deposition of a-Si on one side of the base layer forms a single HJ cell, and deposition of a-Si on both sides of the base layer forms a double HJ cell. An HJ III-V PV cell may be relatively lightweight and/or flexible, allowing use of the HJ III-V PV cell in diverse applications.

The formation of the relatively thin base layer of the III-V base substrate may be achieved by any appropriate layer transfer method including smart cut layer transfer, epitaxial layer transfer, or spalling. Smart cut layer transfer is appropriate for formation of a base layer for a single HJ cell. Smart cut layer transfer comprises hydrogen (H) implantation into the III-V substrate, followed by an annealing in order to initiate cracks within the H-implanted region that then travel into the substrate. However, smart cut layer transfer has some limitations for producing layers thicker than couple of microns. Smart cut layer transfer requires for relatively high implantation energies, which tend to be costly. In addition, the use of high implantation energy may result in implantation damage within the thin film, resulting in degradation of the crystalline quality of the film, which severely degrades cell performance. Smart cut layer transfer is not suitable for double HJ cells, as the a-Si layer formed on the substrate prior to layer transfer cannot withstand the relatively high annealing temperature. Epitaxial layer transfer is appropriate for formation of both single and double HJ cells, and comprises growth of a sacrificial layer below the base layer in the substrate. The sacrificial layer is removed using a wet chemical etch, in order to release the relatively thin base layer from the substrate. Lastly, spalling offers a relatively inexpensive, low-temperature method for separation of a relatively thin base layer from a substrate. The low-temperature nature of spalling allows use in fabrication of both single and double HJ III-V cells.

Figure 1:
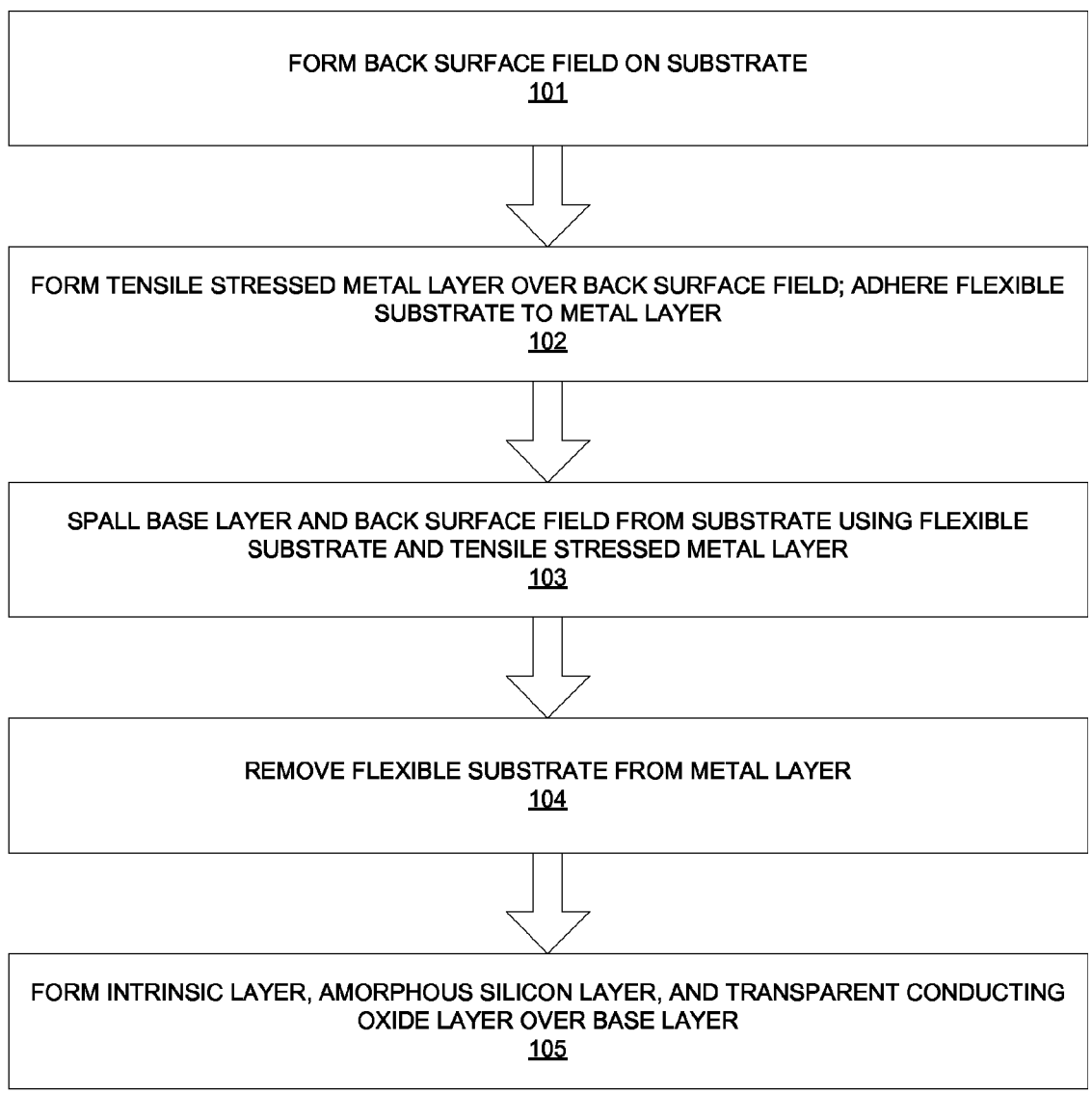
FIG. 1 illustrates an embodiment of a method of forming a single heterojunction III-V PV cell via spalling.
Figure 2:
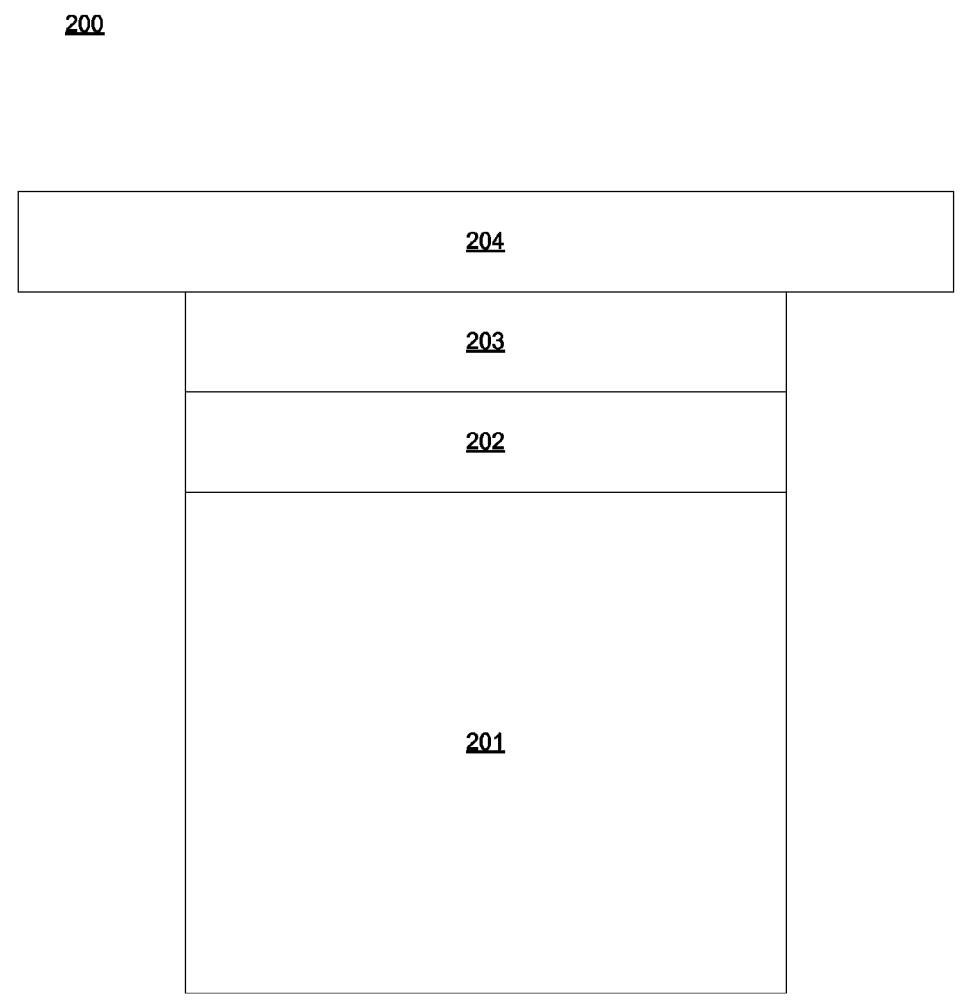

FIG. 1 illustrates an embodiment of a method 100 of forming a single HJ III-V PV cell via spalling. FIG. 1 is discussed with reference to FIGS. 2-4. In block 101, a optional back surface field (BSF) 202 is formed on a wafer of a III-V substrate 201, as shown in FIG. 2. Substrate 201 may comprise germanium (Ge) and/or gallium arsenide (GaAs) in some embodiments. Substrate 201 may comprise an n-type or a p-type substrate. The optional BSF 202 may be formed by depositing a layer of a dopant on the substrate 201, and diffusing the dopant into the substrate 201 in some embodiments, or the optional BSF 202 may comprise a localized back contact. The dopant used to form optional BSF 202 may comprise zinc (Zn), indium (In), or aluminum (Al) in some embodiments. Optional BSF 202 may alternately comprise another material that deposited directly on the substrate 201; the BSF material may have a wider band gap than that of the substrate 201. Some examples of an appropriate BSF material may comprise InGaP (for a Ge substrate), or AlGaAs (for a GaAs substrate).

In block 102, a tensile stressed metal layer 203 is formed, and a flexible substrate layer 204 is adhered to the metal layer 203, as shown in FIG. 2. In embodiments that do not comprise optional BSF 202, metal layer 203 is formed directly on substrate 201. Metal layer 203 may comprise nickel (Ni) in some embodiments. Flexible substrate layer 204 may comprise a flexible adhesive, which may be water-soluble in some embodiments. Use of a rigid material for the flexible substrate layer 204 may render the spalling mode of fracture unworkable. Therefore, flexible substrate layer 204 may further comprise a material having a radius of curvature of less than 5 meters in some embodiments, and less than 1 meter in some exemplary embodiments.

Figure 3:
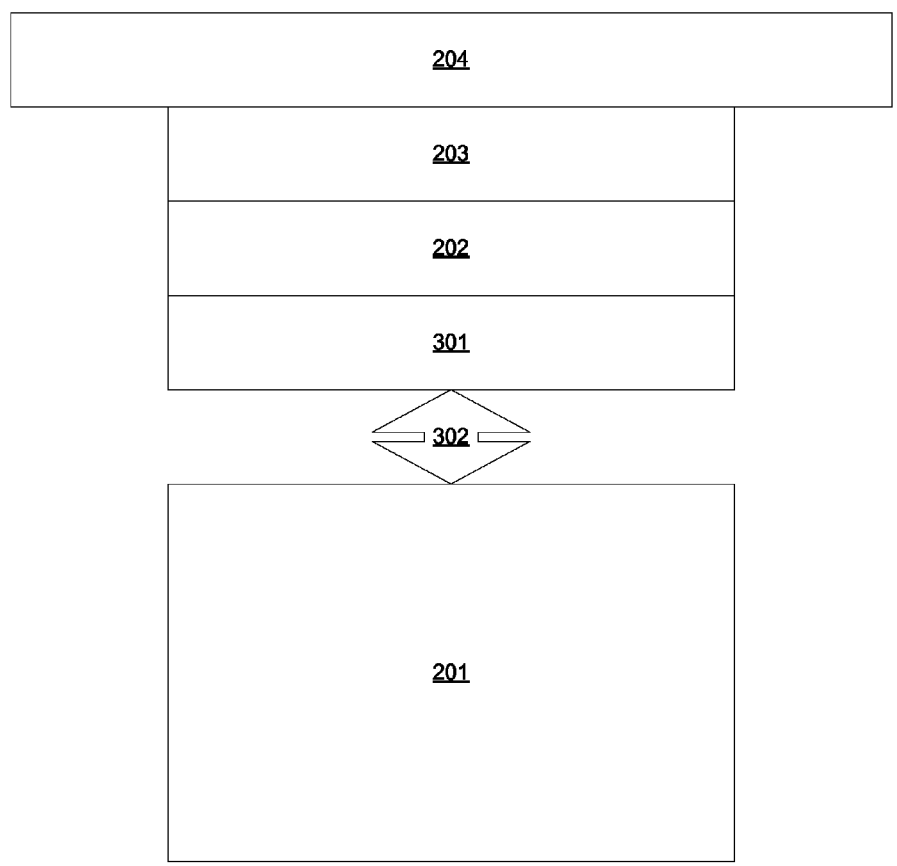
FIG. 3 illustrates an embodiment of spalling using a flexible substrate layer.

In block 103, base layer 301 is spalled from substrate 201, as shown in FIG. 3. The flexible substrate 204 is used to cause the tensile stress in metal layer 203 to form fracture 302 in substrate 201, separating base layer 301 from substrate 201. Base layer 301 comprises the same material as substrate 201, and may be less than about 20 μm thick in some embodiments. The thickness of the base layer 301 is determined by the tensile stress and thickness of metal layer 203. In embodiments comprising optional BSF 202, optional BSF 202 is spalled from substrate 201 along with base layer 301. In block 104, flexible substrate layer 204 is removed from metal layer 203.

Figure 4:
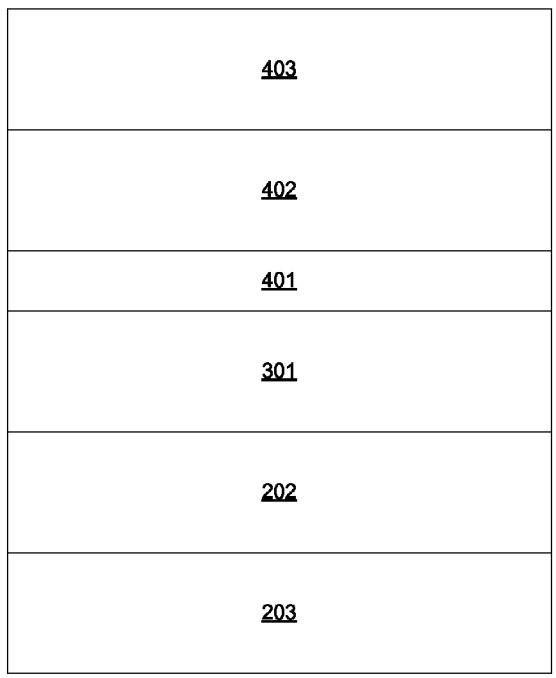
FIG. 4 illustrates an embodiment of a single heterojunction III-V PV cell.

In block 105, a single HJ III-V PV cell 400 is formed using base layer 301, as shown in FIG. 4. Single HJ III-V cell 400 comprises optional BSF 202; however, in some embodiments, base layer 301 may be located directly on metal layer 203, and optional BSF 202 may be absent. Metal layer 203 may comprise a back contact for the single HJ II-IV cell 400. Intrinsic layer 401 is formed on base layer 301, a-Si layer 402 is formed on intrinsic layer 401, and transparent conducting oxide (TCO) layer 403 is formed on amorphous silicon layer 402. The a-Si layer 402 may have a doping type (n-type or p-type) that is opposite the doping type of substrate 201; in such an embodiment, the a-Si layer 402 is configured to act as an emitter for the HJ III-V cell 400. In some embodiments, an a-Si layer 402 configured to act as an emitter may be formed on subtrate 201 or BSF 202 before spalling instead of after spalling. TCO layer 403 may comprise zinc oxide (ZnO) doped with aluminum (Al) in some embodiments. Finger or bus bars (not shown) may be formed on TCO layer 403 in some embodiments.

While some embodiments of single HJ III-V PV cell 400 may comprise a base layer 301 formed by spalling, other embodiments of cell 400 may comprise a base layer 301 formed by smart cut or epitaxial layer transfer. In embodiments using smart cut or epitaxial layer transfer methods, BSF 202 and/or a-Si layer 402 configured to act as an emitter may optionally be formed on substrate 201, then either smart cut or epitaxial layer transfer are used to separate the base layer 301 from the substrate 201. A single HJ III-V cell 400 may then be formed using base layer 301 in the same manner discussed above with respect to block 105.

Figure 6:
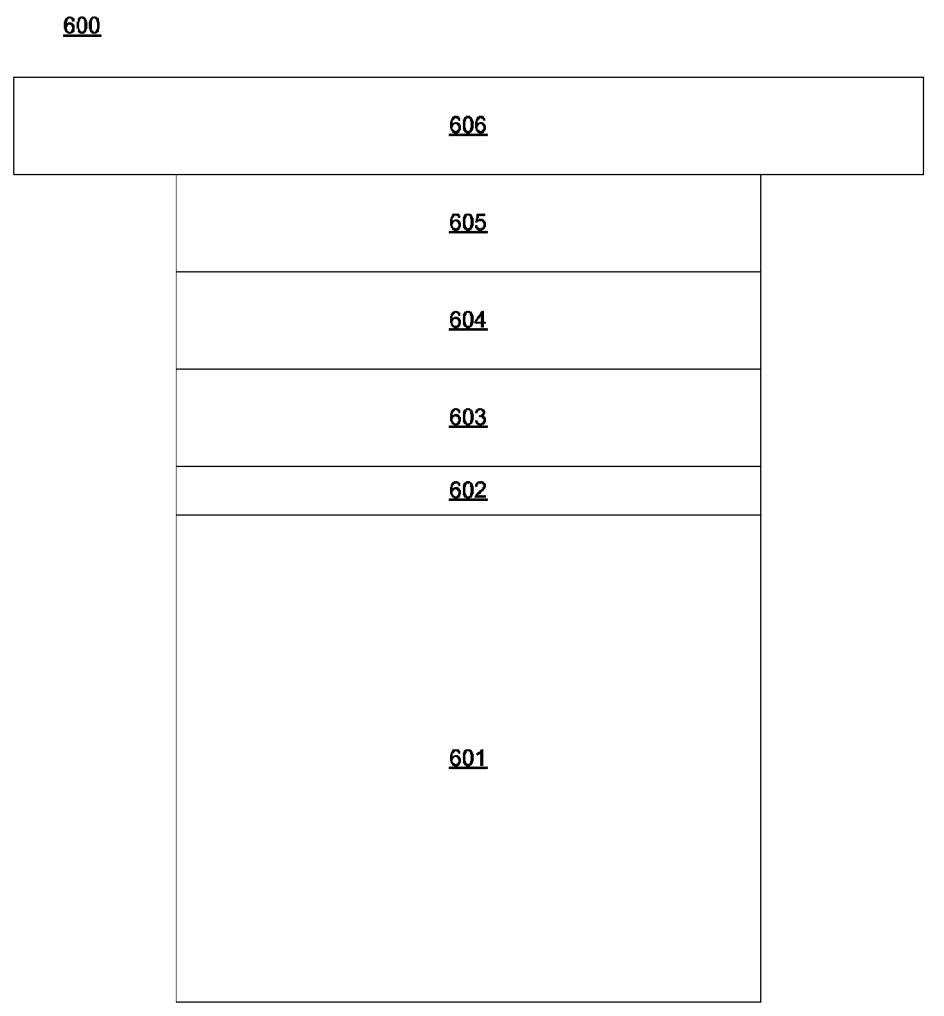

FIG. 5 illustrates an embodiment of a method 500 of forming a double HJ III-V PV cell via spalling. FIG. 5 is discussed with reference to FIGS. 6-8. In block 501, an intrinsic layer 602 is formed in a wafer of a III-V substrate 201, as shown in FIG. 6. Substrate 601 may comprise Ge and/or GaAs in some embodiments. Substrate 601 may comprise an n-type or a p-type substrate. An optional BSF 603 may be formed on intrinsic layer 602 in some embodiments. Optional BSF 603 may comprise a material having a wider band gap than that of the substrate 601. Some examples of an appropriate BSF material may comprise InGaP (for a Ge substrate) or AlGaAs (for a GaAs substrate). An a-Si layer 604 is then formed on intrinsic layer 602 in embodiments not comprising optional BSF 603; in such embodiments, a-Si layer 604 and intrinsic layer 602 may function together as a back surface field. In embodiments comprising optional BSF 603, a-Si layer 604 is formed on optional BSF 603. The a-Si layer 604 may comprise a doping type (n-type or p-type) that is the same as that of substrate 601; in such an embodiment, the a-Si layer 604 may act as a BSF. The a-Si layer 604 may alternately comprise a doping type that is opposite that of substrate 601; in such an embodiment, a-Si layer 604 may act as an emitter.

In block 502, a tensile stressed metal layer 605 is formed on a-Si layer 604, and a flexible substrate layer 606 is adhered to the metal layer 605, as shown in FIG. 6. Metal layer 605 may comprise nickel (Ni) in some embodiments. Flexible substrate layer 606 may comprise a flexible adhesive, which may be water-soluble in some embodiments. Use of a rigid material for the flexible substrate layer 606 may render the spalling mode of fracture unworkable. Therefore, flexible substrate layer 606 may further comprise a material having a radius of curvature of less than 5 meters in some embodiments, and less than 1 meter in some exemplary embodiments.

Figure 7:
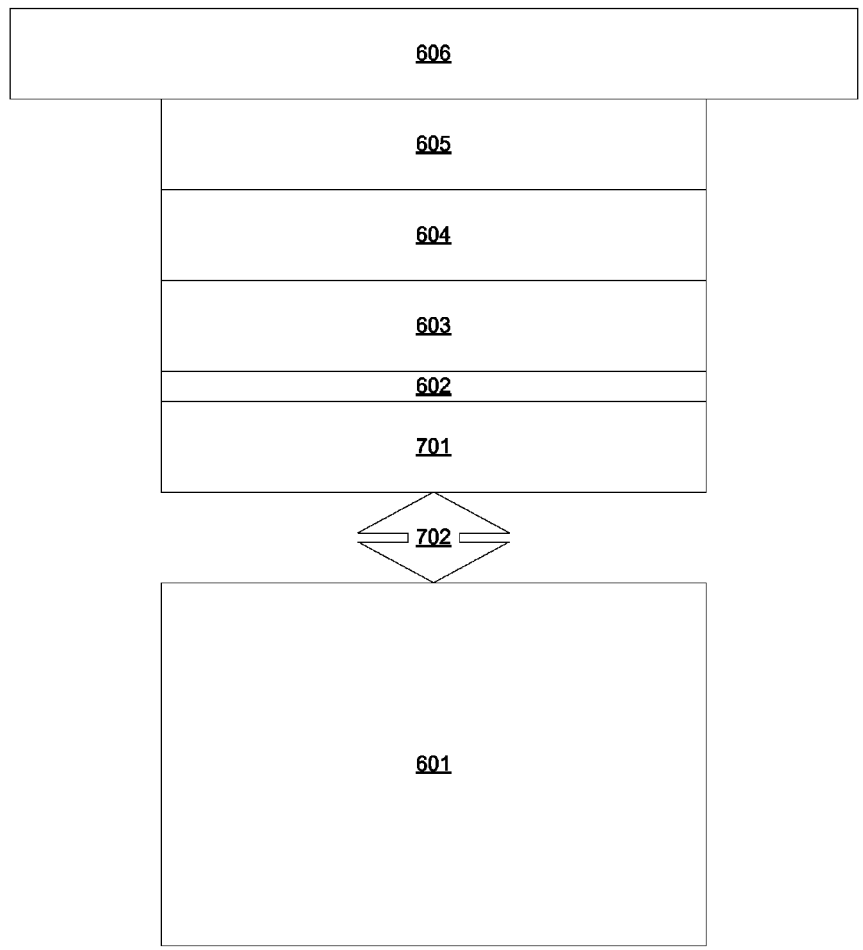
FIG. 7 illustrates an embodiment of spalling using a flexible substrate layer.

In block 503, a base layer 701 is spalled from substrate 601, as shown in FIG. 7. The flexible substrate 606 is used to cause the tensile stress in metal layer 605 to form fracture 702 in substrate 601, separating base layer 701 from substrate 601. Base layer 601 comprises the same material as substrate 601, and may be less than about 20 μm thick in some embodiments. The thickness of the base layer 701 is determined by the tensile stress and thickness of metal layer 605. Intrinsic layer 602, optional BSF 603 (in embodiments comprising optional BSF 603), and a-Si layer 604 are spalled from substrate 601 along with base layer 701. In block 504, flexible substrate layer 606 is removed from metal layer 605.

Figure 8:
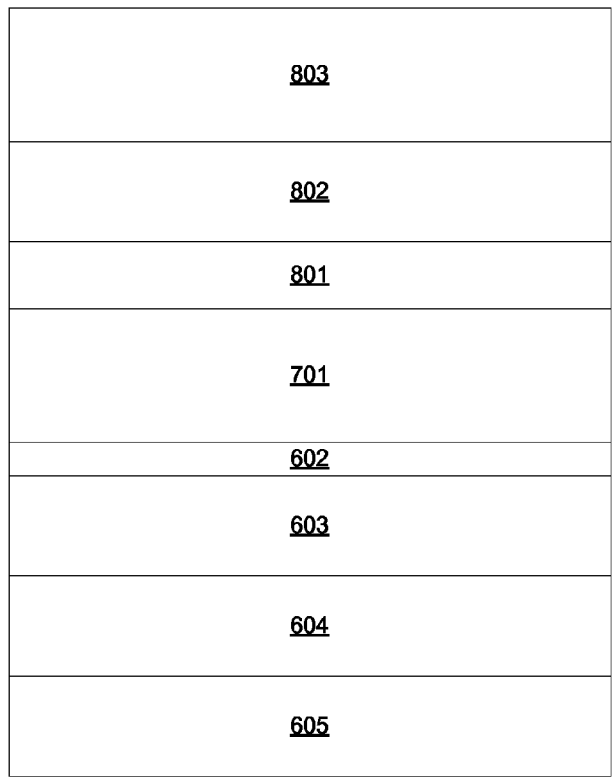
FIG. 8 illustrates an embodiment of a double heterojunction III-V PV cell.

In block 505, a double HJ III-V PV cell 800 is formed using base layer 701, as shown in FIG. 8. Double HJ III-V cell 800 comprises optional BSF 603; however, in some embodiments, intrinsic layer 602 may be located directly on a-Si layer 604, and optional BSF 603 may be absent. Metal layer 605 may comprise a back contact for the single HJ II-IV cell 800. Intrinsic layer 801 is formed on base layer 701, a-Si layer 802 is formed on intrinsic layer 801, and TCO layer 803 is formed on amorphous silicon layer 802. The a-Si layer 802 may comprise a doping type (n-type or p-type) that is opposite the doping type of substrate 601; in such an embodiment, a-Si layer 802 may act as an emitter for double HJ III-IV cell 800. TCO layer 803 may comprise zinc oxide (ZnO) doped with aluminum (Al) in some embodiments. Finger or bus bars (not shown) may be formed on TCO layer 803 in some embodiments.

While some embodiments of double HJ III-V PV cell 800 may comprise a base layer 701 formed by spalling, other embodiments of cell 800 may comprise a base layer 701 formed by epitaxial layer transfer. In embodiments using epitaxial layer transfer to form base layer 701, a sacrificial layer is formed in the substrate 601, then intrinsic layer 602, optional BSF 603, and a-Si layer 604 are formed on substrate 601. The base layer 701, intrinsic layer 602, optional BSF 203, and a-Si layer 604 are separated from the substrate 601 at the sacrificial layer. A double HJ III-V cell 800 may then be formed using base layer 701, intrinsic layer 602, optional BSF 203, and a-Si layer 604 in the same manner discussed above with respect to block 505.

The technical effects and benefits of exemplary embodiments include formation of a lightweight, flexible solar cell.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A heterojunction III-V photovoltaic (PV) cell, comprising:
   a tensile stressed metal layer;
   a first amorphous silicon layer located on the tensile stressed metal layer;
   a back surface field located on the first amorphous silicon layer;
   an first intrinsic layer located on the back surface field layer;
   a base layer comprising a III-V substrate located on the first intrinsic layer, the base layer being less than about 20 microns thick;
   an second intrinsic layer located on the base layer;
   an second amorphous silicon layer located on the intrinsic layer; and
   a transparent conducting oxide layer located on the amorphous silicon layer.

2. The heterojunction III-V PV cell of claim 1, wherein the back surface field comprises at least one of zinc, indium, or aluminum.

3. The heterojunction III-V PV cell of claim 1, wherein the second amorphous silicon layer comprises a doping type that is opposite a doping type of the substrate, and the second amorphous silicon layer is configured to act as an emitter.

4. The heterojunction III-V PV cell of claim 1, wherein the second amorphous silicon layer comprises a doping type that is the same as a doping type of the substrate, and the second amorphous silicon layer is configured to act as a back surface field.

5. The heterojunction III-V PV cell of claim 1, wherein the second amorphous silicon layer comprises a doping type that is opposite to a doping type of the substrate, and the second amorphous silicon layer is configured to act as an emitter.

6. The heterojunction III-V PV cell of claim 1, wherein the tensile stressed metal layer comprises nickel.

7. The heterojunction III-V PV cell of claim 1, wherein the III-V substrate comprises one of germanium or gallium arsenide.

* * * * *